(12) United States Patent
Motoyui

(10) Patent No.: US 7,851,926 B2
(45) Date of Patent: Dec. 14, 2010

(54) SEMICONDUCTOR DEVICE

(75) Inventor: Toshiaki Motoyui, Shiga (JP)

(73) Assignee: Renesas Electronics Corporation, Kanagawa (JP)

( * ) Notice: Subject to any disclaimer, the term of this patent is extended or adjusted under 35 U.S.C. 154(b) by 256 days.

(21) Appl. No.: 12/249,226

(22) Filed: Oct. 10, 2008

(65) Prior Publication Data

US 2009/0108459 A1 Apr. 30, 2009

(30) Foreign Application Priority Data

Oct. 30, 2007 (JP) ............................. 2007-281232

(51) Int. Cl.
- H01L 23/52 (2006.01)
- H01L 23/48 (2006.01)
- H01L 29/40 (2006.01)

(52) U.S. Cl. .............................. 257/776; 257/E23.141; 257/758; 257/773; 438/460

(58) Field of Classification Search .......... 257/E21.318, 257/E21.335, E29.006, E21.102, E21.237, 257/48, 750, 758, 773–776, 781; 438/14, 438/460, 462

See application file for complete search history.

(56) References Cited

U.S. PATENT DOCUMENTS

| | | | | |
|---|---|---|---|---|
| 4,949,139 | A * | 8/1990 | Korsh et al. ................. | 327/391 |
| 5,583,359 | A * | 12/1996 | Ng et al. ...................... | 257/306 |
| 5,594,272 | A * | 1/1997 | Matsuki ....................... | 257/579 |
| 5,939,766 | A * | 8/1999 | Stolmeijer et al. ........... | 257/534 |
| 6,473,290 | B2 * | 10/2002 | Mochida ...................... | 361/291 |
| 6,490,020 | B2 * | 12/2002 | Kung .......................... | 349/117 |
| 6,542,351 | B1 * | 4/2003 | Kwang ........................ | 361/303 |
| 6,653,681 | B2 * | 11/2003 | Appel .......................... | 257/307 |
| 6,819,542 | B2 * | 11/2004 | Tsai et al. .................... | 361/304 |
| 6,870,223 | B2 * | 3/2005 | Kumagai et al. ............. | 257/343 |
| 7,045,418 | B2 * | 5/2006 | Mitros et al. ................. | 438/257 |
| 7,222,531 | B2 * | 5/2007 | Isogai et al. ............. | 73/335.04 |
| 7,259,956 | B2 * | 8/2007 | Fong et al. ............... | 361/306.2 |
| 7,471,093 | B2 * | 12/2008 | Arisaka ....................... | 324/664 |
| 2004/0182153 | A1 * | 9/2004 | Hamamoto ............... | 73/335.04 |
| 2005/0156201 | A1 * | 7/2005 | Matsuda ...................... | 257/213 |

FOREIGN PATENT DOCUMENTS

JP 2000-311953 11/2000

* cited by examiner

Primary Examiner—Chris Chu
(74) Attorney, Agent, or Firm—Young & Thompson

(57) ABSTRACT

A semiconductor device includes first underlying lines in an underlying wiring layer electrically connected to and shaped like a first semiconductor region, second underlying lines in the underlying wiring layer electrically connected to and shaped like a second semiconductor region, a first intermediate line in an intermediate wiring layer electrically connected to the first underlying lines, the first intermediate line including finger regions shaped like the first underlying lines, a coupling section to electrically interconnect the finger regions, a second intermediate line in the intermediate wiring layer electrically connected to the second underlying lines, the second intermediate line including finger regions shaped like the second underlying lines, and a coupling section to electrically connect the finger regions, a first overlying line in an overlying wiring layer electrically connected to the first intermediate line, and a second overlying line in the overlying wiring layer electrically connected to the second intermediate line.

12 Claims, 17 Drawing Sheets

SEMICONDUCTOR DEVICE

BACKGROUND

1. Field of the Invention

The present invention relates to a semiconductor device and, more specifically, to a semiconductor device including a power transistor.

2. Description of Related Art

For forming a high-power transistor, a plurality of MOS (Metal Oxide Semiconductor) transistors may be formed on a semiconductor substrate, and in these transistors, sources, drains, and others may be connected in common. Japanese Unexamined Patent Application Publication No. 2000-311953 describes such a power transistor with an exemplary use in an H bridge circuit. In Japanese Unexamined Patent Application Publication No. 2000-311953, the drawings all show the power transistor incorporated in the H bridge circuit, and thus for simplification of the drawing, FIGS. 15 to 17 show an exemplary case where the power transistor is a power MOSFET (Metal Oxide Semiconductor Field-Effect Transistor). By referring to FIGS. 15 to 17, described below is the configuration of such a power transistor.

FIG. 15 is a diagram showing the layout of a semiconductor substrate 100 with source regions 1, drain regions 3, and gate electrodes 2 formed thereon. Note here that FIG. 15 is not showing the semiconductor substrate and the semiconductor chip in their entirety but schematically showing a part of the layout in which a power transistor is disposed on the semiconductor substrate 100. As shown in FIG. 15, for forming a power transistor on the semiconductor substrate 100, a source region 1 (SOURCE), a gate electrode 2 (GATE), a drain region 3 (DRAIN), and a gate electrode 2 (GATE) are generally repeatedly disposed in this order, i.e., repeating structure. The source region 1 and the drain region 3 are each a diffusion layer formed on the semiconductor substrate 100, and the gate electrode 2 is a polysilicon line formed on the semiconductor substrate 100 with a gate oxide film (not shown) or the like interposed therebetween.

As shown in FIG. 15, the gate electrodes 2 are connected in common, and are electrically connected to a gate line (not shown) or the like. The source regions 1 are respectively connected, via contacts or the like, to underlying source lines 10 that will be described later by referring to FIGS. 16 and 17. The source regions 1 are also connected to a source pad 101 via an overlying source line 11. Similarly, the drain regions 3 are respectively connected to underlying drain lines 30, and are connected to a drain pad 102 via an overlying drain line 31.

By referring to FIGS. 16 and 17, described next is the wiring configuration of a typical power transistor. FIG. 16 is a top view of the power transistor, showing the underlying source lines 10, the underlying drain lines 30, the overlying source line 11, the overlying drain line 31, contacts 80 between the underlying and overlying source lines 10 and 11, and contacts 90 between the underlying and overlying drain lines 30 and 31. Note that FIG. 16 is not showing the source regions 1, the drain regions 3, and the contacts connecting these diffusion regions and the underlying lines. FIG. 17 is a schematic cross-sectional view of the power transistor of FIG. 16 taken along a line XVII-XVII.

As shown in FIG. 17, an interlayer insulation film 20 is formed on the semiconductor substrate 100. The source lines 10, and the drain lines 30 are formed on this interlayer insulation film 20. As shown in FIG. 16, the source lines 10 are substantially parallel to the source regions 1, and the drain lines 30 are substantially parallel to the drain regions 3. The source regions 1 and the drain regions 3 are connected to the source lines 10 and the drain lines 30 respectively by contacts 21.

A second interlayer insulation film 22 is formed over the underlying lines, i.e., the source lines 10 and the drain lines 30. The overlying lines, i.e., the source line 11 and the drain line 31 are formed on the second interlayer insulation film 22. As shown in FIG. 16, the overlying lines, i.e., the source line 11 and the drain line 31, are each formed from an extremely large and wide layer covering about a half of the area where the MOS transistors are formed. Such lines are hereinafter referred to as solidly-formed wiring layers. The overlying source line 11 is electrically connected to the source pad 101. The overlying drain line 31 is electrically connected to the drain pad 102. The contacts 80 are formed in the second interlayer insulation film 22 located below the overlying source line 11. With these contacts 80, the underlying source lines 10 are electrically connected to the overlying source line 11. The contacts 90 are formed in the second interlayer insulation film 22 located below the overlying drain line 31. With these contacts 90, the underlying drain lines 30 are electrically connected to the overlying drain line 31. FIG. 17 shows only the contacts 90 since it is the cross-sectional view of the portion where the overlying drain line 31 is formed. On the other hand, only the contacts 80 are formed below the portion where the overlying source line 11 is formed.

A semiconductor chip may have a plurality of power transistors. If this is the case, configuring a semiconductor chip forming a power transistor with the above-described two types of wiring layers, i.e., the overlying and underlying lines, will pose a difficulty. This thus results in a need for a semiconductor chip using a larger number of types of wiring layers.

In the resulting semiconductor chip, however, depending on the shape, size, and others of the wiring layers formed between the underlying lines and the overlying lines, i.e., uppermost solidly-formed wiring layers in the power transistor, we have now discovered that current concentration occurs in the underlying lines and the area in the vicinity of the pads in the power transistor, thereby possibly shortening the life of elements.

There thus has been a demand for preventing the increase of current density concentrated in a part of the lines with consideration given to the shape of such intermediate lines located between underlying lines and overlying lines connected to pads in a semiconductor device including a power transistor.

SUMMARY

A first exemplary aspect of an embodiment of the present invention is a semiconductor device that includes a plurality of first underlying lines in an underlying wiring layer electrically connected to and shaped similar to a first semiconductor region, a plurality of second underlying lines in the underlying wiring layer electrically connected to and shaped similar to a second semiconductor region, a first intermediate line in an intermediate wiring layer electrically connected to the plurality of first underlying lines, the first intermediate line including a plurality of finger regions shaped similarly to the plurality of first underlying lines, and a coupling section to electrically connect the finger regions with each other, a second intermediate line in the intermediate wiring layer electrically connected to the plurality of second underlying lines, the second intermediate line including a plurality of finger regions shaped similarly to the plurality of second underlying lines, and a coupling section to electrically connect the finger regions with each other, a first overlying line in an overlying wiring layer electrically connected to the first intermediate line, and a second overlying line in the overlying wiring layer electrically connected to the second intermediate line.

Such a structure enables to prevent any possible current concentration with respect to underlying or overlying lines.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

Figure 1:
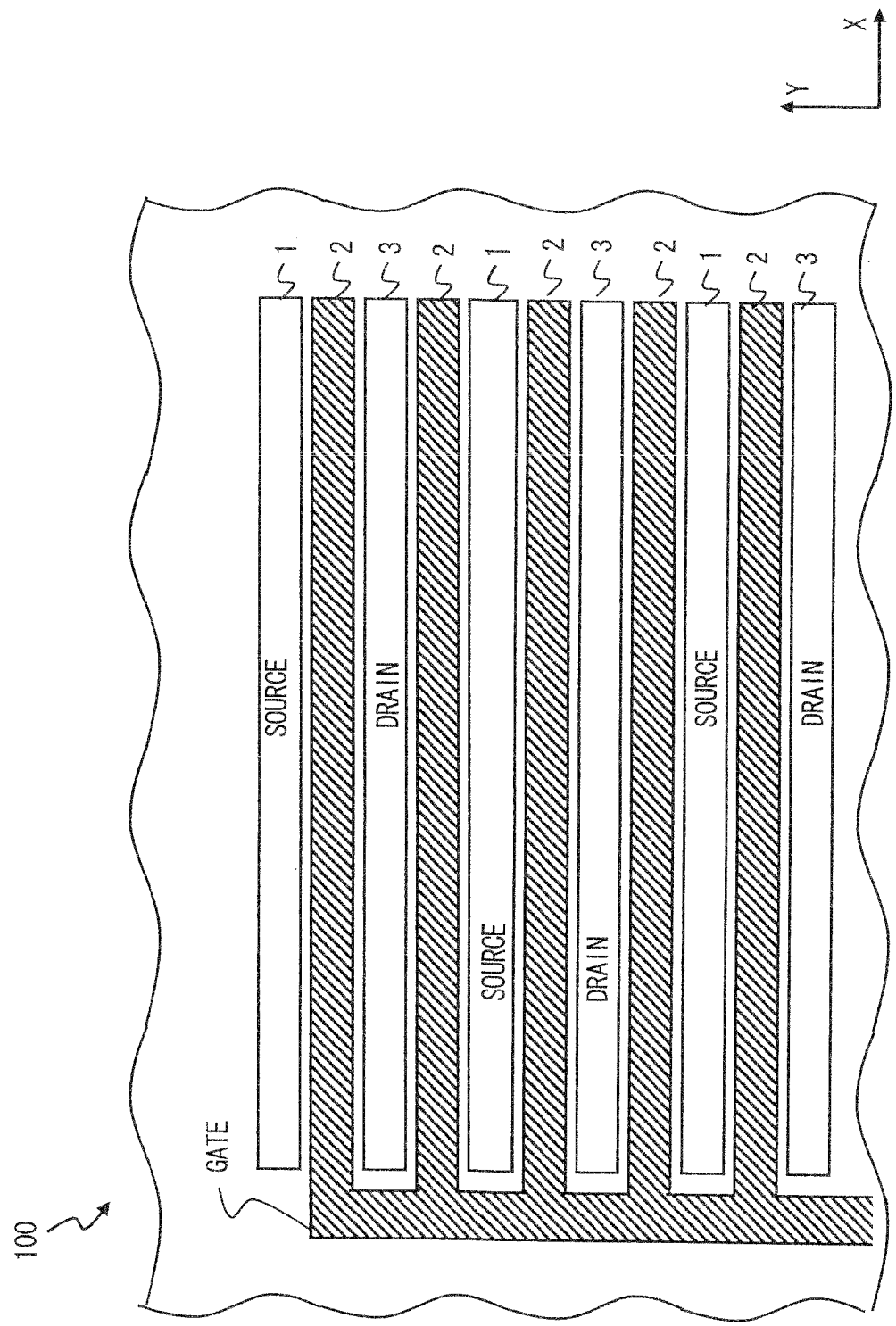
FIG. 1 is a diagram showing the layout of a transistor of a first embodiment.

In the below, embodiments of the invention are described in detail by referring to the accompanying drawings. Herein, in FIGS. 1 to 4, any component similarly operating as that described in the section of Background is provided with the same reference numeral.

First Exemplary Embodiment

FIG. 1 is a diagram showing the layout of the semiconductor substrate 100 having source regions 1 (a first semiconductor region), drain regions 3 (a second semiconductor region), and gate electrodes 2 formed thereon. In the below, a detailed description is given by referring to FIGS. 1 to 4, and in this embodiment, a field-effect transistor is formed from the source regions 1, the gate electrodes 2, and the drain regions 3 formed on the semiconductor substrate (or well) 100 as such. The source regions 1 and the drain regions 3 are formed from second conductivity-type impurity diffusion regions formed on the first conductivity-type semiconductor substrate (well) 100. The gate electrodes 2 are each formed from a polysilicon layer formed on the semiconductor substrate 100 with a gate oxide film (not shown) or the like interposed therebetween.

FIG. 1 is not showing the semiconductor substrate and the semiconductor chip in their entirety but schematically showing a part of the layout in which a power transistor is disposed on the semiconductor substrate 100. As shown in FIG. 1, on the semiconductor substrate, the diffusion regions and the gate electrodes are extending in a first direction (X direction in the drawing). The diffusion regions and the gate electrodes are repeatedly disposed, along a second direction (Y direction in the drawing), in the order of the source region (SOURCE), the gate electrode (GATE), the drain region (DRAIN), the gate electrode (GATE), and the source region (SOURCE), i.e., repeating structure.

As shown in FIG. 1, the gate electrodes 2 are connected in common, and are electrically connected to a gate line (not shown) or the like. The source regions 1 are respectively connected, via contacts or the like, to the source lines 10 (a plurality of first underlying lines) in an underlying wiring layer that will be described later by referring to FIGS. 2 to 4. Although the details will be given later, the source lines 10 in the underlying wiring layer are also connected to a source line 12 in an intermediate wiring layer, and to the source line 11 in an overlying wiring layer so that the source pad 101 and the source regions 1 are electrically connected in common. Similarly, the drain regions 3 are electrically connected to the drain pad 102 via the drain lines 30 (a plurality of second underlying lines) in the underlying wiring layer, a drain line 32 in the intermediate wiring layer, and the drain line 31 in the overlying wiring layer.

Figure 2:
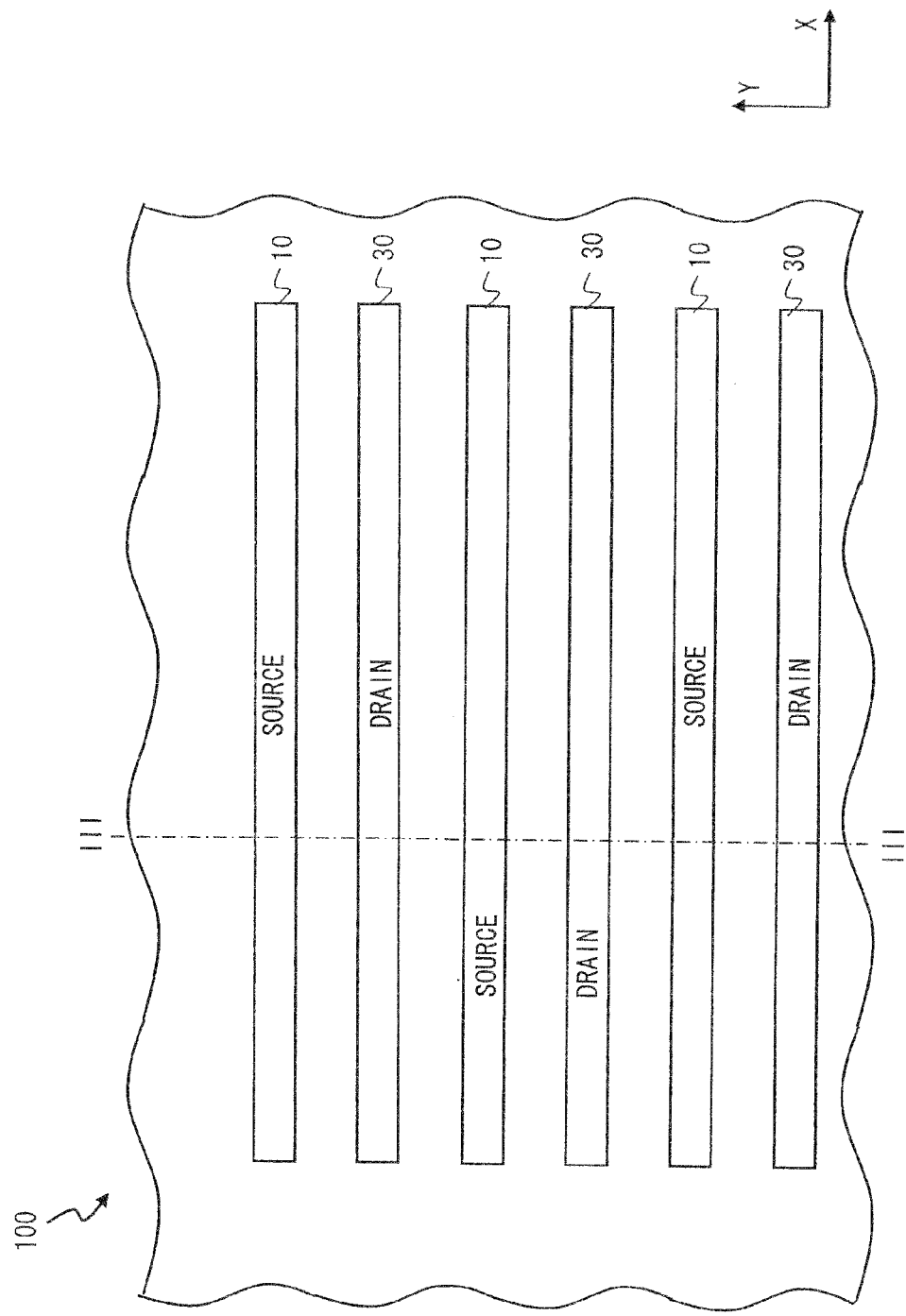
FIG. 2 is a diagram showing the layout of a first layer of the first embodiment.
Figure 3:
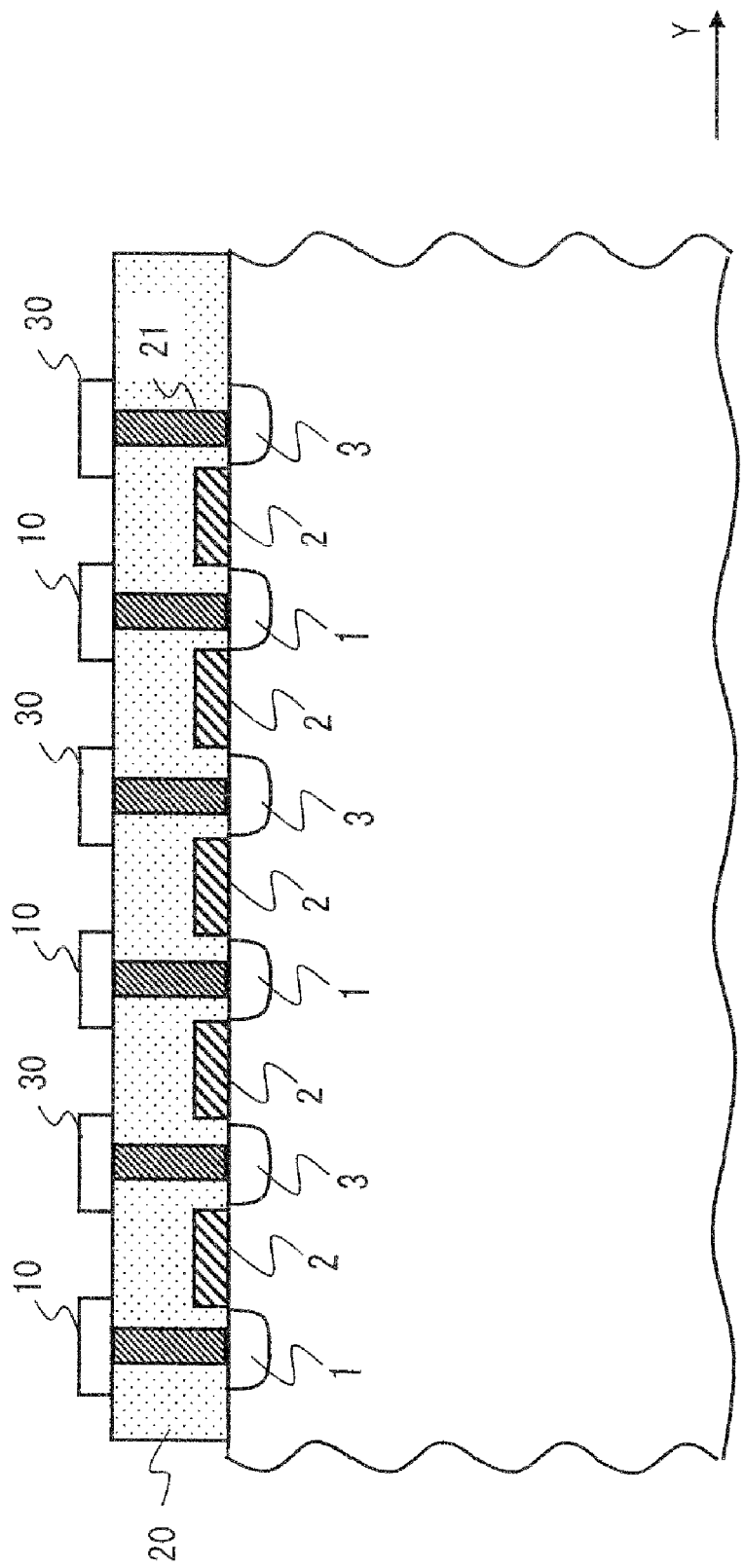
FIG. 3 is a cross-sectional view of FIG. 2 taken along a line III-III.

By referring to FIGS. 2 and 3, described now is the wiring configuration of a power transistor of this embodiment. FIG. 2 is a diagram showing the source lines 10 and the drain lines 30 in the underlying wiring layer. Note that, unlike FIG. 1, FIG. 2 is not showing the source regions 1, the gate electrodes 2, the drain regions 3, and the contacts connecting these diffusion regions and the lines in the underlying wiring layer. FIG. 3 is a schematic cross-sectional view of the power transistor of FIG. 2 taken along a line III-III.

As shown in FIG. 2, a plurality of lines 10 and 30 in the first (underlying) wiring layer are shaped similarly to the source region 1 and the drain region 3, respectively.

Figure 4:
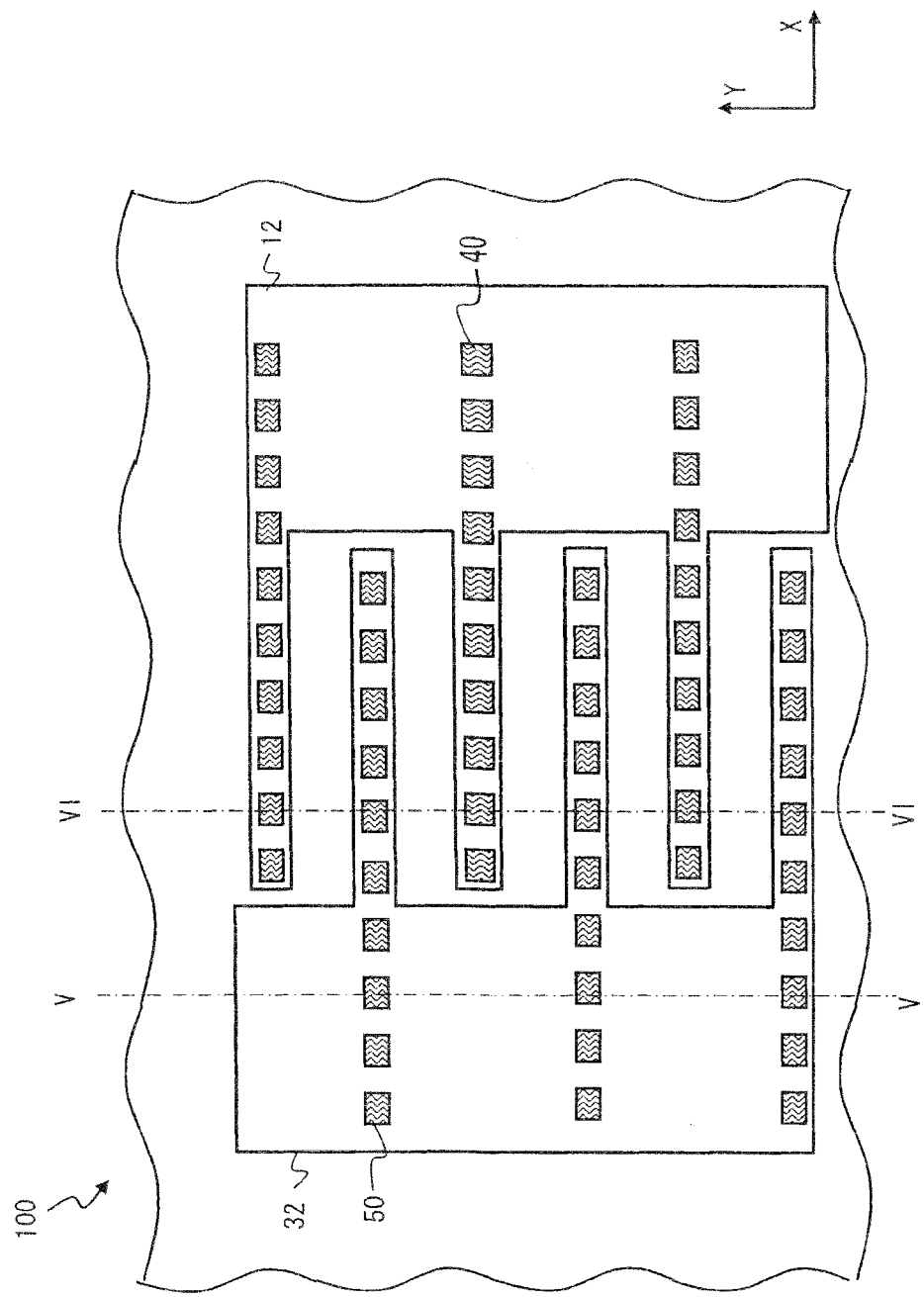
FIG. 4 is a diagram showing a intermediate wiring layer, and contacts between the first and intermediate wiring layers of the first embodiment.
Figure 5:
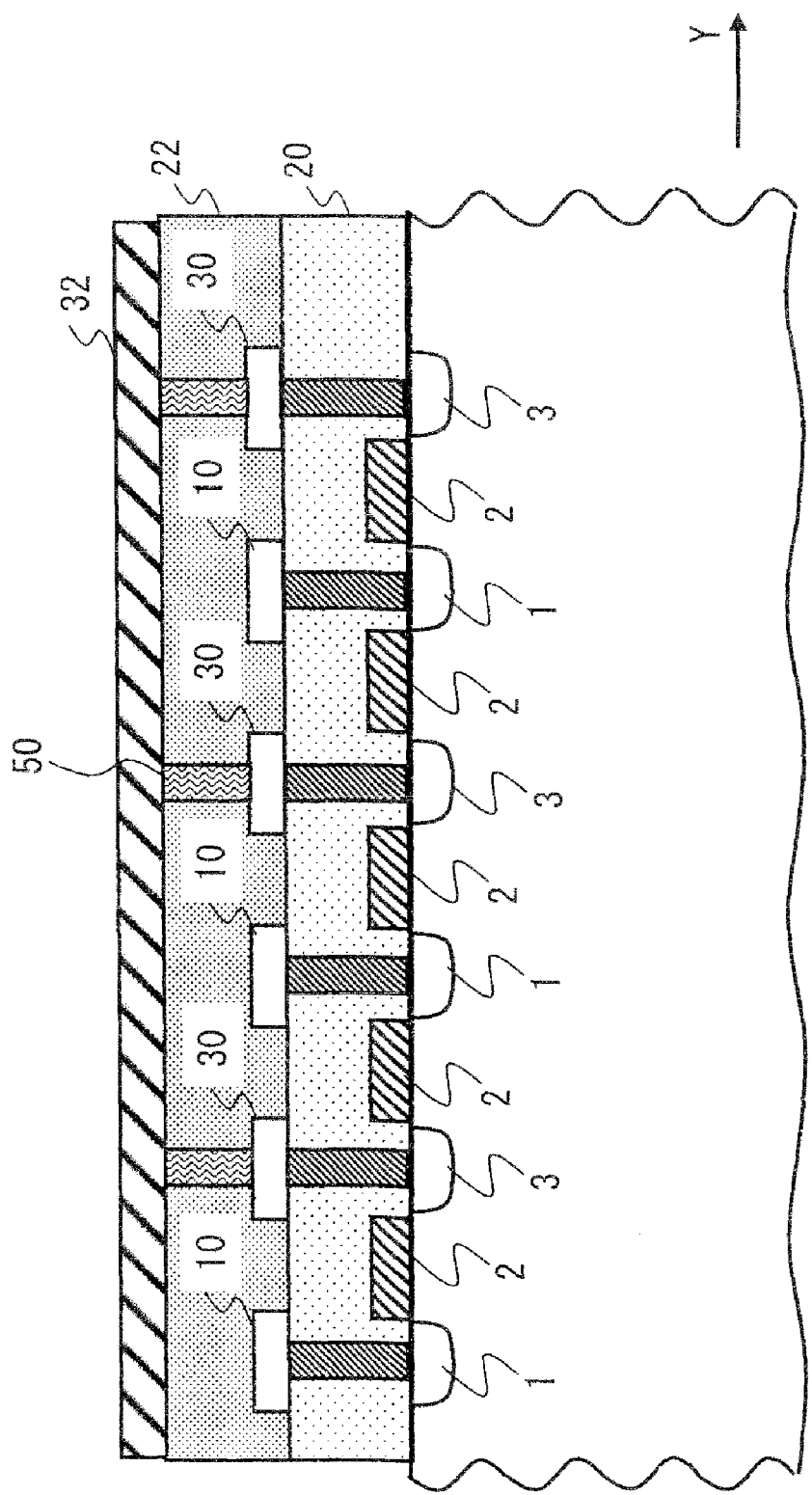
FIG. 5 is a cross-sectional view of FIG. 4 taken along a line V-V.
Figure 6:
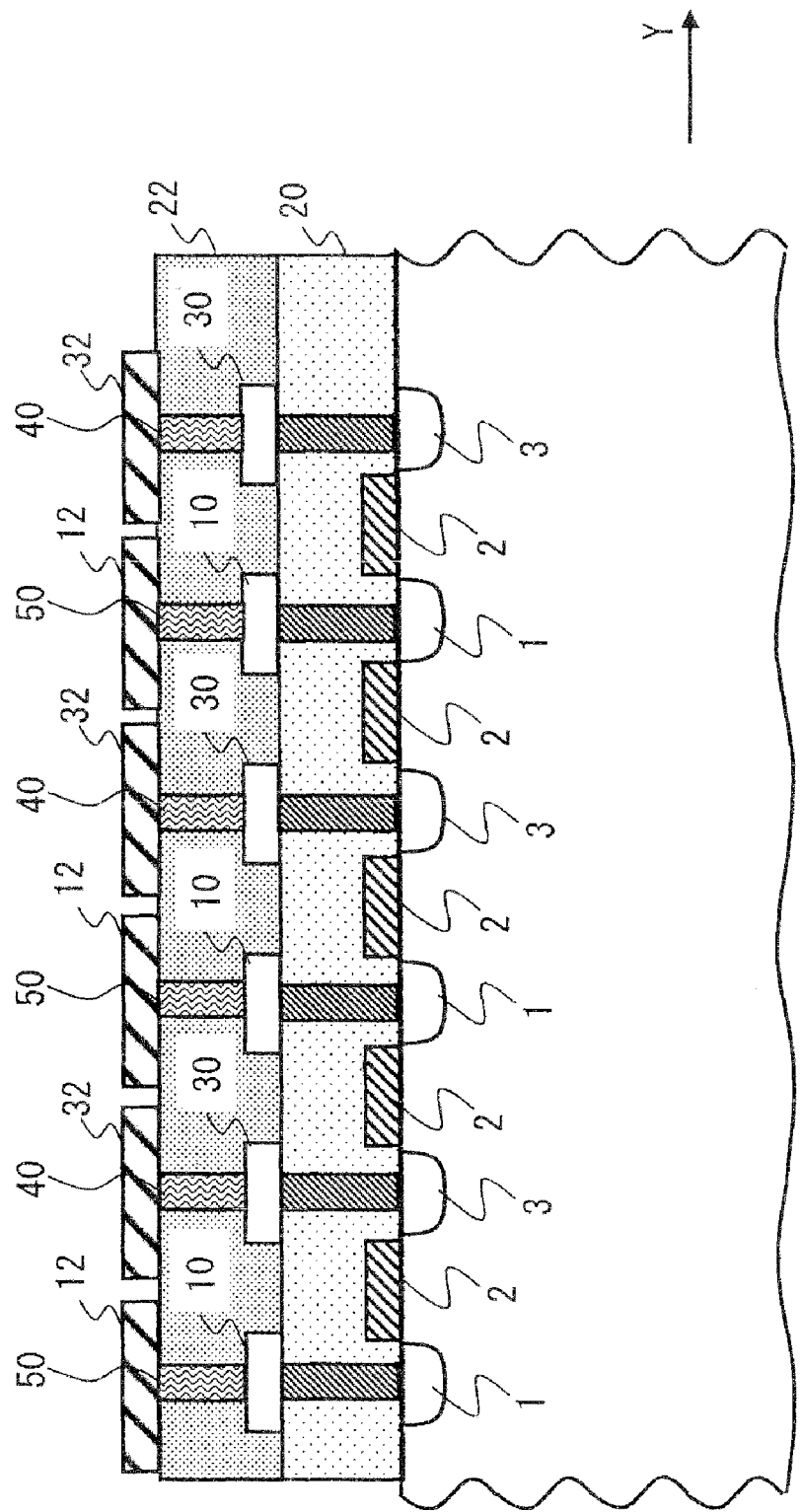
FIG. 6 is a cross-sectional view of FIG. 4 taken along a line VI-VI.

As shown in FIG. 3, the semiconductor substrate 100 has the interlayer insulation film 20 formed thereon. This interlayer insulation film 20 has the source lines 10 and the drain lines 30 formed thereon. As shown in FIG. 2, the source lines 10 are substantially parallel to the source regions 1, and the drain lines 30 are substantially parallel to the drain regions 3. FIG. 4 is a top view of the source line 12 in the second (intermediate) wiring layer, the drain line 32 in the second (intermediate) wiring layer, contacts 40 between the source lines 10 and 12 in the underlying wiring layer, and contacts 50 between the drain lines 30 and 32 in the intermediate wiring layer. For simplification of the drawing, the source lines 10 and the drain lines 30 in the underlying wiring layer are not shown, for example. FIG. 5 is a cross-sectional view of FIG. 4 taken along a line V-V, and FIG. 6 is a cross-sectional view of FIG. 4 taken along a line VI-VI. On the lines in the underlying wiring layer, i.e., the source lines 10 and the drain lines 30, the second interlayer insulation film 22 is formed, and this second interlayer insulation film 22 has the lines in the intermediate wiring layer, i.e., the source line 12 and the drain line 32 formed thereon.

As shown in FIG. 4, in this embodiment, the intermediate wiring layer has a characteristic shape. By taking the drain line 32 (a second intermediate line) in the intermediate wiring layer as an example, a specific description is now given. That is, the drain line 32 in the intermediate wiring layer includes a rectangular-shaped line, and strip-shaped lines. The rectangular-shaped line is a portion formed in the direction along which the transistors are arranged in line (Y direction in the drawing, the second direction) over substantially the entire area, and the strip-shaped lines are each a portion formed substantially parallel to the drain regions 3 similarly to the drain lines 30 in the underlying wiring layer. That is, the drain line 32 in the intermediate wiring layer has a plurality of first regions each shaped similarly to the underlying lines, and a coupling section, which is formed in the same layer as the first regions and connecting the plurality of the first regions to each other. Similarly, the source line 12 (a first intermediate line) in the intermediate wiring layer includes a portion formed in the direction along which the transistors are formed in line (Y direction in the drawing, the second direction) over substantially the entire area, and portions each formed substantially parallel to the source regions 1. Hereinafter, such source and drain lines in the intermediate wiring layer are each referred to as semi-solidly-formed wiring layer.

FIG. 5 is a cross-sectional view of the area where the drain line 32 in the intermediate wiring layer is formed in the Y direction in the drawing over substantially the entire area, i.e., the area is solidly-formed, and includes the coupling section of the drain line 32. FIG. 5 shows only the contacts 50 connecting the drain lines 30 and 32 in the first and intermediate wiring layers since it is the cross-sectional view of FIG. 4 taken along a V-V line. The cross-sectional view of FIG. 6 is the one taken along a line VI-VI (Y direction in the drawing), and therein, the source and drain lines 12 and 32 in the intermediate wiring layer are disposed alternately. Accordingly, in FIG. 6, the contacts 40 connecting the source lines 10 and 12 in the first and intermediate wiring layers and the above-described contacts 50 are also disposed alternately.

Figure 7:
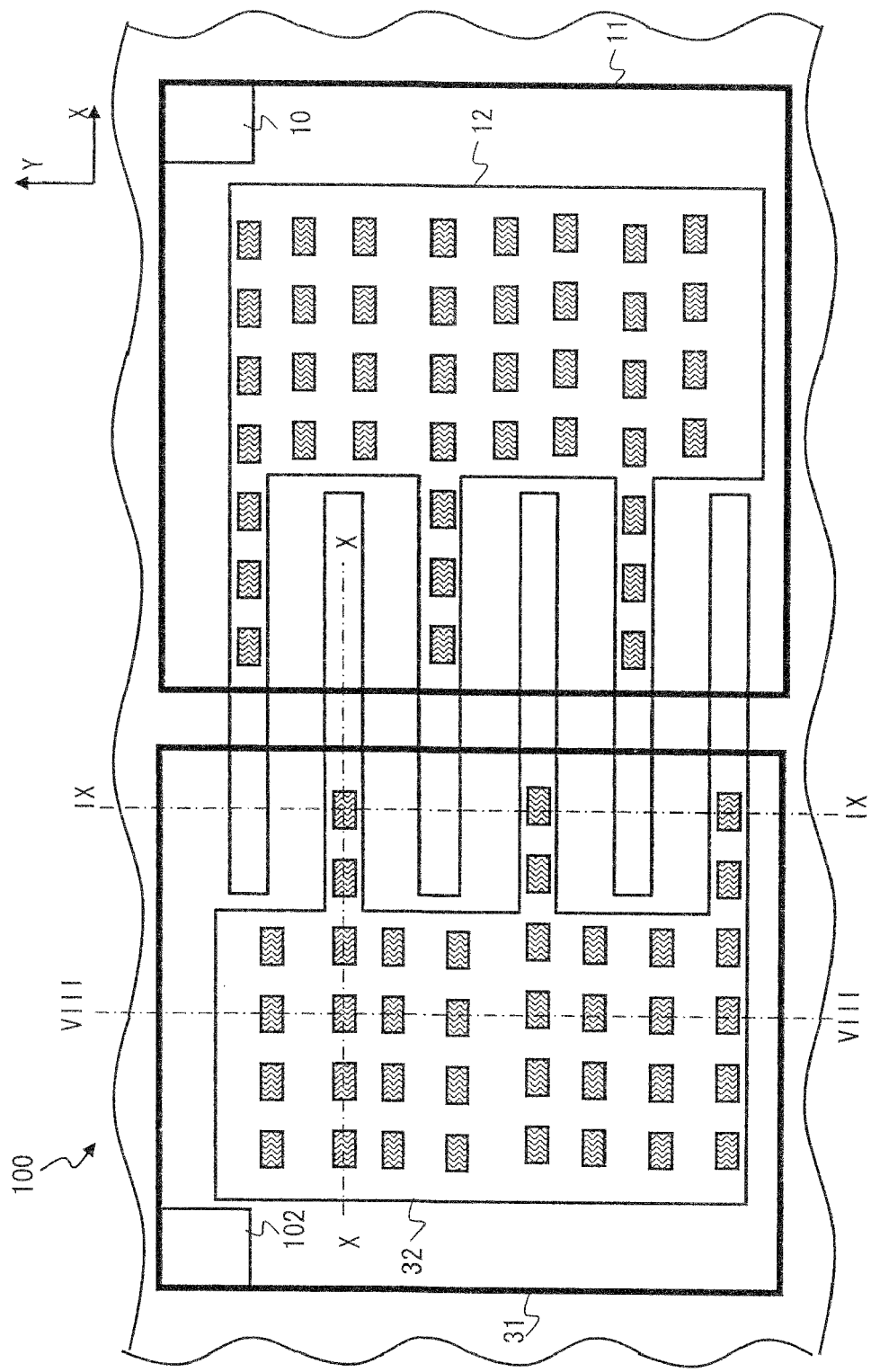
FIG. 7 is a diagram showing the intermediate wiring layer, a overlying wiring layer, and contacts between the intermediate and overlying wiring layers of the first embodiment.
Figure 8:
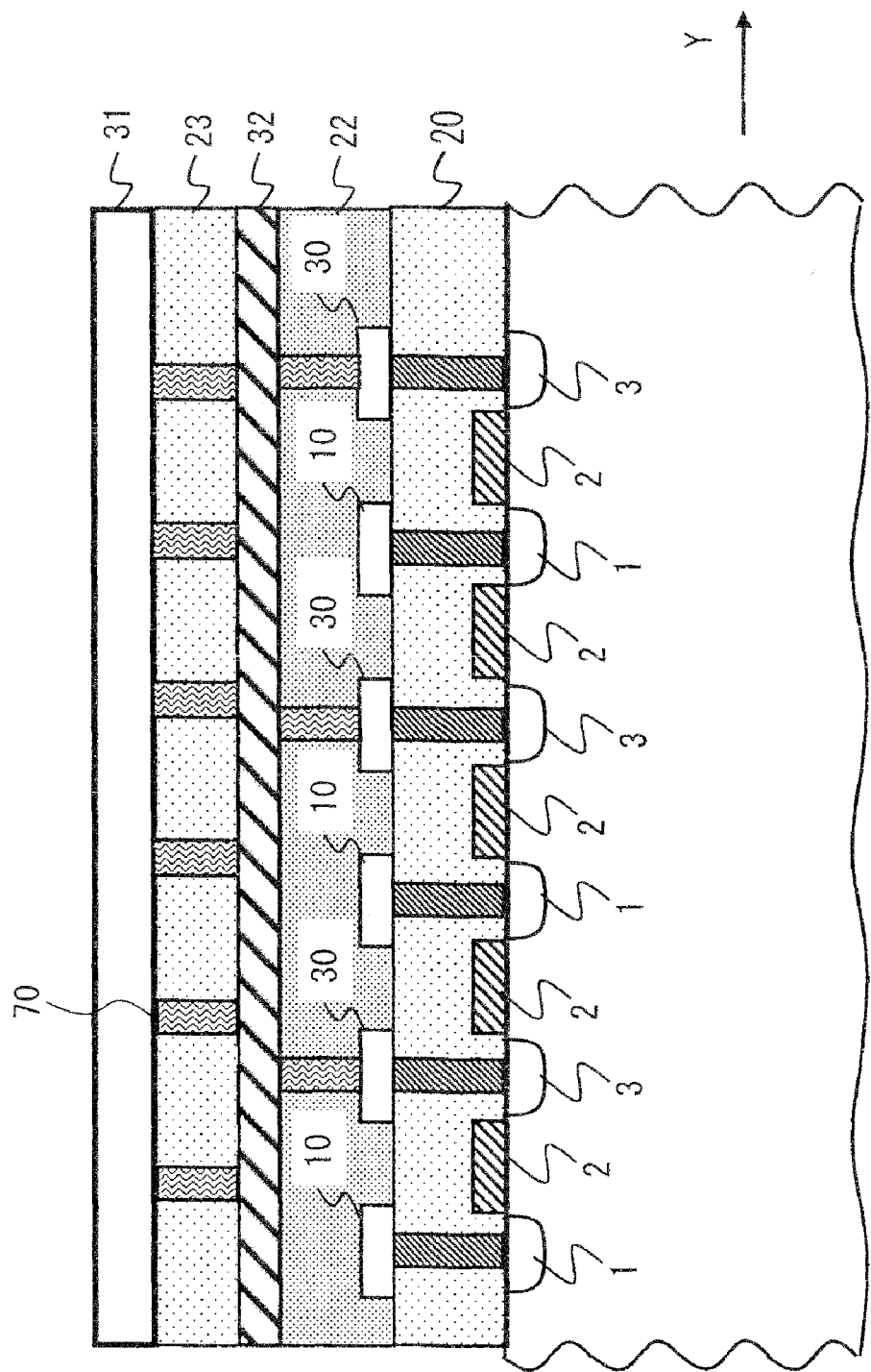
FIG. 8 is a cross-sectional view of FIG. 7 taken along a line VIII-VIII.
Figure 9:
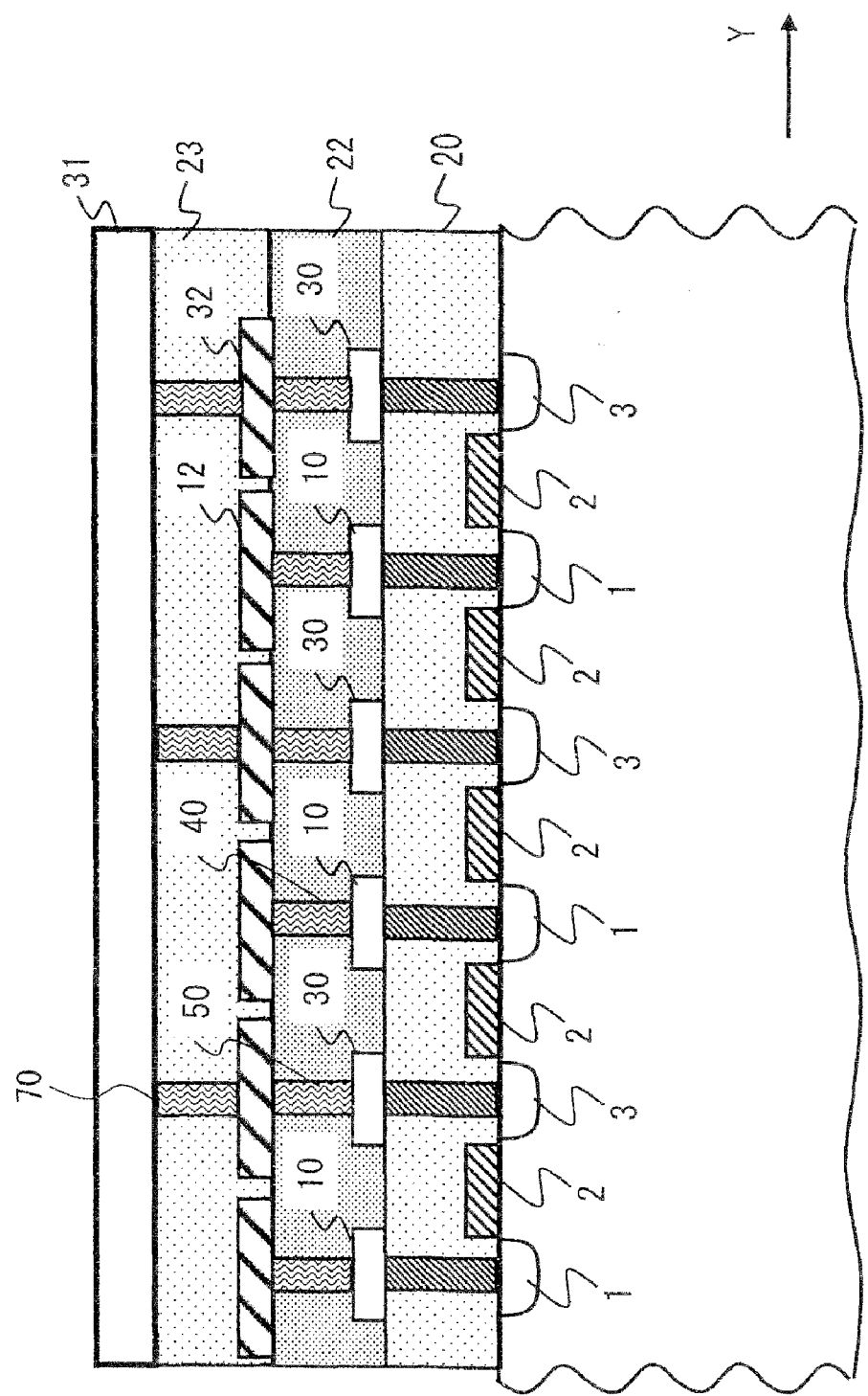
FIG. 9 is a cross-sectional view of FIG. 7 taken along a line IX-IX.

FIG. 7 is a schematic view of the source line 12 and the drain line 32 in the intermediate wiring layer, the source line 11 and the drain line 31 in the third (overlying) wiring layer, and the contacts for wiring connection between the intermediate and overlying wiring layers, all of which are viewed from above. FIG. 8 is a cross-sectional view of FIG. 7 taken along a line VIII-VIII, and FIG. 9 is a cross-sectional view of FIG. 7 taken along a line IX-IX. As shown in FIG. 8, the intermediate wiring layer has a third interlayer insulation film 23 formed thereon.

In FIG. 7, an area indicated by a thick chain line denotes the overlying wiring layer. As shown in FIG. 7, the source line 11 (a first overlying line) and the drain line 31 (a second overlying line) in the overlying wiring layer are each extremely large and wide, i.e., covering about a half of the area in the X direction in the drawing where the MOS transistors are formed. Such lines are hereinafter referred to as solidly-formed wiring layers. By taking the drain line 31 as an example in the overlying wiring layer, the drain line 31 is formed over the drain region covering about a half thereof in the same direction as the extending direction of the drain region, i.e., in the X direction in the drawing, and is formed in the direction along which the transistors are formed in line, i.e., Y direction in the drawing over substantially the entire area. The source line 11 in the overlying wiring layer is similarly formed to be solidly-formed at the position laterally symmetrical to the drain line 31.

FIG. 8 is cross-sectional view of the area where the drain line 32 in the intermediate wiring layer is formed in the Y direction in the drawing over substantially the entire area. In the coupling section of the second drain line 32, i.e., the rectangular-shaped line, the contacts 70 connecting the drain line 32 in the intermediate wiring layer and the drain line 31 in the overlying wiring layer are larger in number than in the first regions, i.e., the strip-shaped lines, in the Y direction in the drawing, i.e., the second direction. In the cross-sectional view of FIG. 9, because the source line 12 and the drain line 32 in the intermediate wiring layer are alternately disposed, the contacts 70 connecting the drain line 32 in the intermediate wiring layer and the drain line 31 in the overlying wiring layer are each formed at the position corresponding to the drain line 32 in the intermediate wiring layer.

Figure 10:
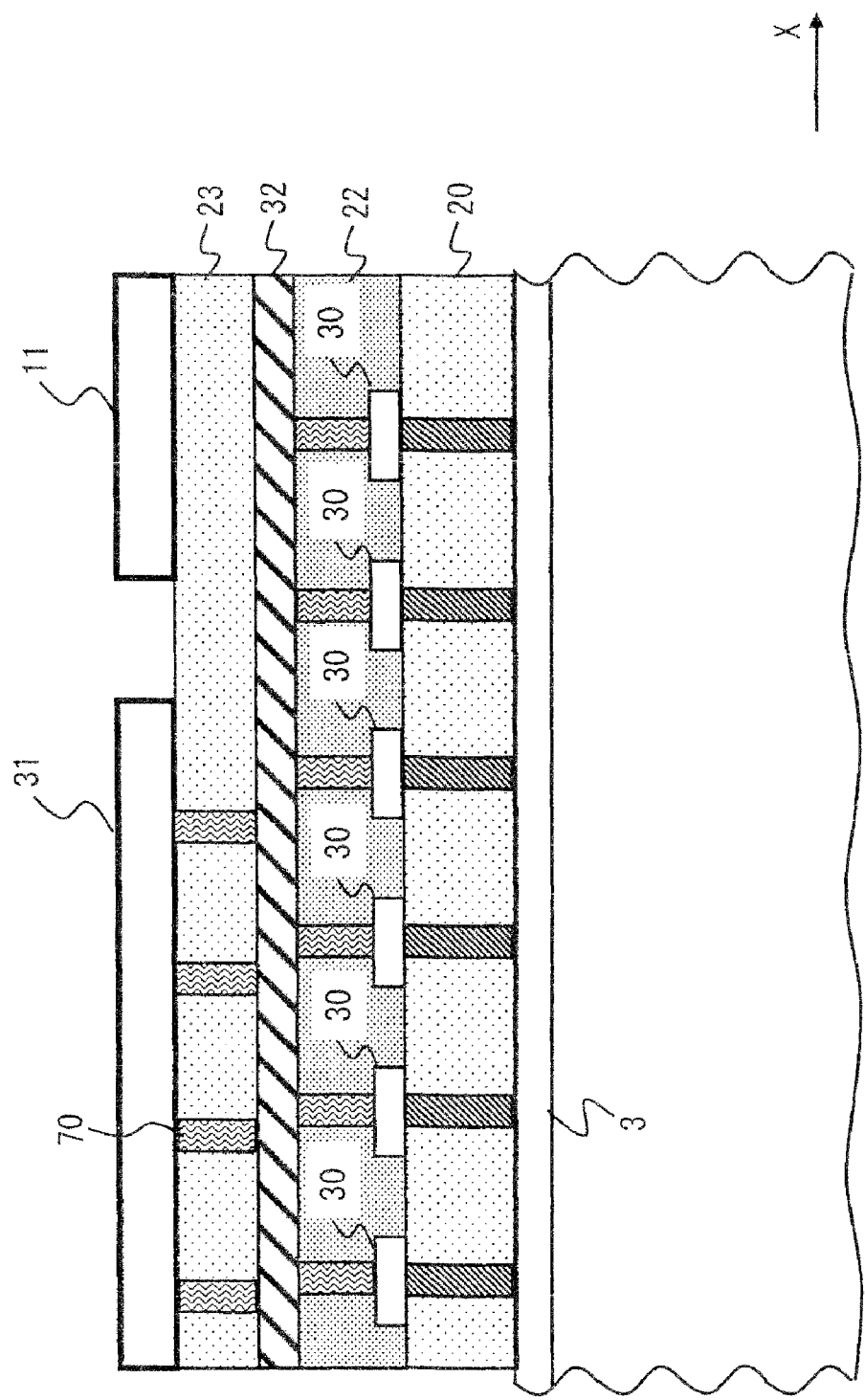
FIG. 10 is a cross-sectional view of FIG. 7 taken along a line X-X.

FIG. 10 is a cross-sectional view of FIG. 7 taken along a line X-X. As shown in FIGS. 7 and 10, the drain line 32 in the intermediate wiring layer is also formed partially below the source line 11 in the overlying wiring layer. For the part, no contact is formed between the lines in the second and overlying wiring layers, thereby causing no short circuit between the sources and drains. As shown in FIG. 10, when attention is given only to an area immediately above any given one line of either type of lines, i.e., the source lines 10 or the drain lines 30, the contacts between the intermediate and overlying wiring layers are fewer in number than those between the underlying and intermediate wiring layers.

Described now is the reason why the intermediate line, i.e., the intermediate wiring layer in this embodiment, is shaped as above in a semiconductor device forming a power transistor using a larger number of types of lines.

With a power transistor, the flowing current is large in amount, and thus the current density in the wiring path is problematically high. Considered here is a case where the lines in the intermediate wiring layer in this embodiment are solidly-formed as are those in the overlying wiring layer, i.e., formed to cover the area of the source or drain regions almost a half in the X direction in the drawing, and formed entirely over the area formed with the transistors in the Y direction in the drawing, e.g., shaped similar to the line 11 or 31 in the overlying wiring layer in FIG. 7. In this case, even if the maximum amount of current flows in the area in the vicinity of the source and drain pads 101 and 102, the current density from that point onward can be suppressed low, thereby increasing the allowance with respect to the current density in the area in the vicinity of the source and drain pads 101 and 102. However, when the lines in the second and overlying wiring layers are solidly-formed, the current is concentratedly directed to the source line 10 and the drain line 30 in the underlying wiring layer, which are shaped similar to the source region 1 and the drain region 3, respectively. This thus causes the current concentration in the underlying wiring layer, thereby resulting in deterioration of the lines in the underlying wiring layer in terms of life of wiring.

Considered now is another case where, similarly to the lines in the underlying wiring layer, the lines in the intermediate wiring layer in the embodiment are shaped substantially parallel to the source region 1 and the drain region 3. In this case, when the maximum amount of current flows to the source and drain pads 101 and 102, the current is directed only to the lines in the overlying wiring layer, i.e., solidly-formed wiring layers, because the lines in the intermediate wiring layer have no solidly-formed portion. This increases the current concentration in the area in the vicinity of the pads, and thus the lines in the overlying wiring layer are increased in current density, thereby possibly resulting in life deterioration of the lines in the overlying wiring layer.

In consideration thereof, in this embodiment, the lines in the intermediate wiring layer are each configured to include a portion extending entirely over the area where the MOS transistors are formed (in the X direction in the drawing), and portions shaped substantially parallel to the source and drain regions. Such a configuration is aimed to reduce the possible increase of the overall current density in the lines.

In the below, described in detail is the configuration of the lines in the intermediate wiring layer for reducing the possible increase of the overall current density in the lines.

As described by referring to FIGS. 1 to 10, the lines to be connected to the source and drain pads 101 and 102 are configured to be solidly-formed as the source and drain lines 11 and 31, and the lines to be connected to the source and drain regions 1 and 3 are formed from thin wires substantially parallel to the source and drain regions 1 and 3. These thin wires are also arranged parallel to one another.

Figure 11:
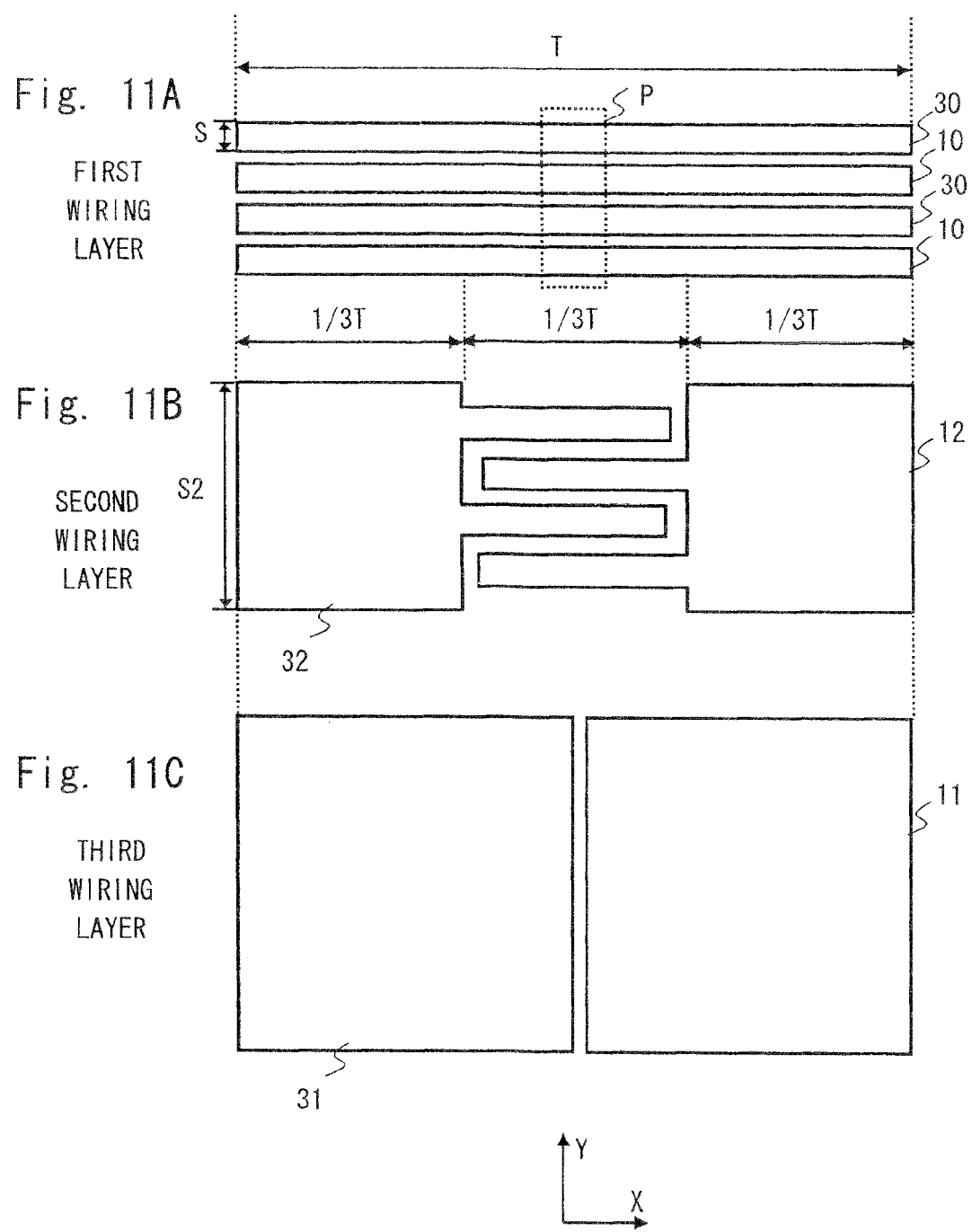
FIGS. 11A to 11C are diagrams showing the shape of each wiring layer of the first embodiment.

FIGS. 1 to 10 referred to in the above explanation are all schematic diagrams for use to describe the configuration of the semiconductor device in the first embodiment of the invention. FIG. 11 shows, more in detail, the layout of the lines of the underlying to overlying wiring layers. Assuming that the lines in the intermediate wiring layer are solidly-formed as the source and drain lines 11 and 31 of FIG. 7, when the maximum amount of current flows, the highest current density is observed in the vicinity of substantially the center of the width of the source region 1 or that of the drain region 3 (indicated by T in a of FIG. 11), i.e., in the vicinity of the boundary between the solidly-formed wiring layers in the overlying wiring layer (the source and drain lines 11 and 31). When the lines in the intermediate wiring layer are solidly-formed, a half of the entire drain current is concentratedly directed to the corresponding portion of the lines in the underlying wiring layer. Therefore, in the portion and therearound, it is considered preferable to reduce the current density as much as possible with respect to the lines 10 and 30 in the underlying wiring layer. In consideration thereof, in this embodiment, as shown in b of FIG. 11, the portion of the intermediate line intermediate wiring layer in this embodiment) corresponding to the area in the vicinity of the boundary between the overlying lines (overlying wiring layer in this embodiment; refer to c of FIG. 11) is preferably shaped considering the shape of the lines in the underlying wiring layer instead of being formed entirely over the area where the transistors are formed, i.e., the semi-solidly-formed configuration described above.

In consideration thereof, in the embodiment, when viewed in the X direction in the drawing, as a whole, the source line 12 in the intermediate wiring layer (or the drain line 32 thereof) has the width of almost (T×⅔) where T denotes the width of the source region 1 or the drain region 3 in the X direction in the drawing. The reason for the width of almost (T×⅔) is to prevent any possible contact between the source line 32 and the drain line. As for the lines in the intermediate wiring layer, the area corresponding to T×⅓ from the end of the source region (or from the end of the drain region) is solidly-formed, i.e., formed entirely over the area where the transistors are formed in the Y direction in the drawing. The portion corresponding to the remaining T×⅓ is shaped similar to the source regions 1 or the drain regions 3 as are the source lines 10 in the underlying wiring layer (or the drain lines 30 thereof). That is, the source line extends in the X direction in the drawing with the length of T×⅔, and about ½ (T×⅓) of the extended length of T×⅔ is solidly-formed, i.e., the coupling section.

The lines in the intermediate wiring layer shaped as such can contribute to reduce the source and drain currents, from ½ to ⅓ of the maximum amount, concentratedly directed to the lines in the underlying wiring layer (a of FIG. 11; area enclosed by dotted line P) in the vicinity of the boundary between the lines in the overlying wiring layer, i.e., the source line 11 and the drain line 31. Moreover, because the lines in the intermediate wiring layer are solidly-formed partially, i.e., the area of T×⅓, as described above, the current concentration with respect to the solidly-formed wiring layers 11 and 31 in the overlying wiring layer can be favorably reduced, thereby leading to the reduction of current concentration also on the source and drain pads, for example. Accordingly, assuming that any one of the lines in the underlying wiring layer, e.g., the source line 10, has the length of T in the first direction, i.e., X direction in the drawing, and the length of S in the second direction, i.e., Y direction in the drawing, the lines in the intermediate wiring layer are configured to include portions each extending in the first direction with the length substantially the same as the length S of the lines in the underlying wiring layer in the second direction, and a portion extending in the first direction with a length S2, which is longer than the length S of the lines in the underlying wiring layer in the second direction. In other words, the lines in the intermediate wiring layer have the area shaped similar to the lines in the underlying wiring layer, and the lines in the intermediate wiring layer of the similar shape are connected in common by the coupling section formed in a different portion from that area in the intermediate wiring layer. Such a configuration enables to increase the life of the lines in the first and overlying wiring layers, and also the life of the semiconductor device as is prevented from deteriorating. Note that, for preventing any possible current concentration in the vicinity of the source and drain lines in the overlying wiring layer, preferably, the portion corresponding to about ⅓ of the length of the source lines in the underlying wiring layer from the end portion of the source line 10 thereof (or the drain line 30 thereof) may be formed to be longer than the length S of the lines in the underlying wiring layer in the second direction, and for coupling thereto, another portion corresponding to about ⅓ of the source lines in the underlying wiring layer may be shaped similar to the source lines thereof. As for the length of the rectangular-shaped line and that of the strip-shaped lines in the intermediate wiring layer, in the relationship between the overlying and underlying wiring groups, the longer the overlapping length, the likelier the current density can be prevented from being increased. Accordingly, the length of the rectangular-shaped line and that of the strip-shaped lines may be determined as appropriate by taking this fact into account.

Second Exemplary Embodiment

Figure 12:
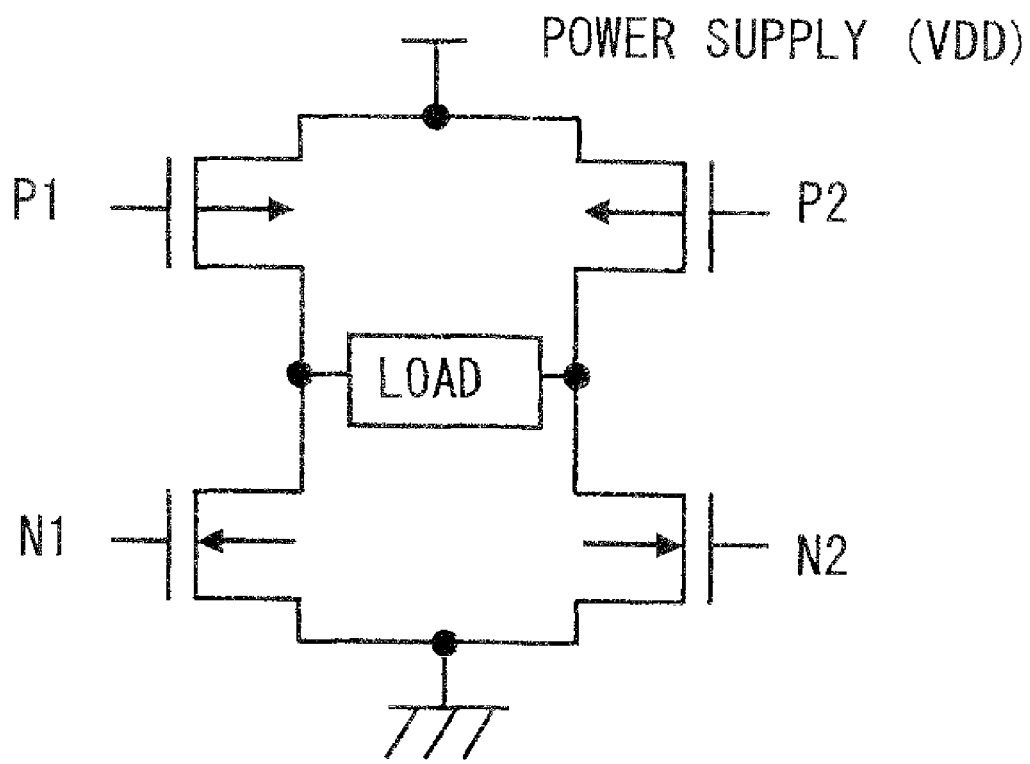
FIG. 12 is a circuit diagram of an H bridge circuit of a second embodiment.

In a second embodiment, exemplified is a case where the configuration of the power transistor of the first embodiment is applied to an H bridge circuit. As shown in FIG. 12, in the H bridge circuit, a P-type MOS transistor P1 and an N-type transistor N1 in series are connected in parallel with a P-type MOS transistor P2 and an N-type MOS transistor N2 in series. Between the P-type transistors and the N-transistors, nodes (drains of the transistors P1 and N1, and drains of the transistors P2 and N2) are used as two output terminals to drive a load such as motor. The sources of the P-type MOS transistors are each provided with a power supply potential, and the sources of the N-type MOS transistors are each provide with a ground potential.

Figure 13:
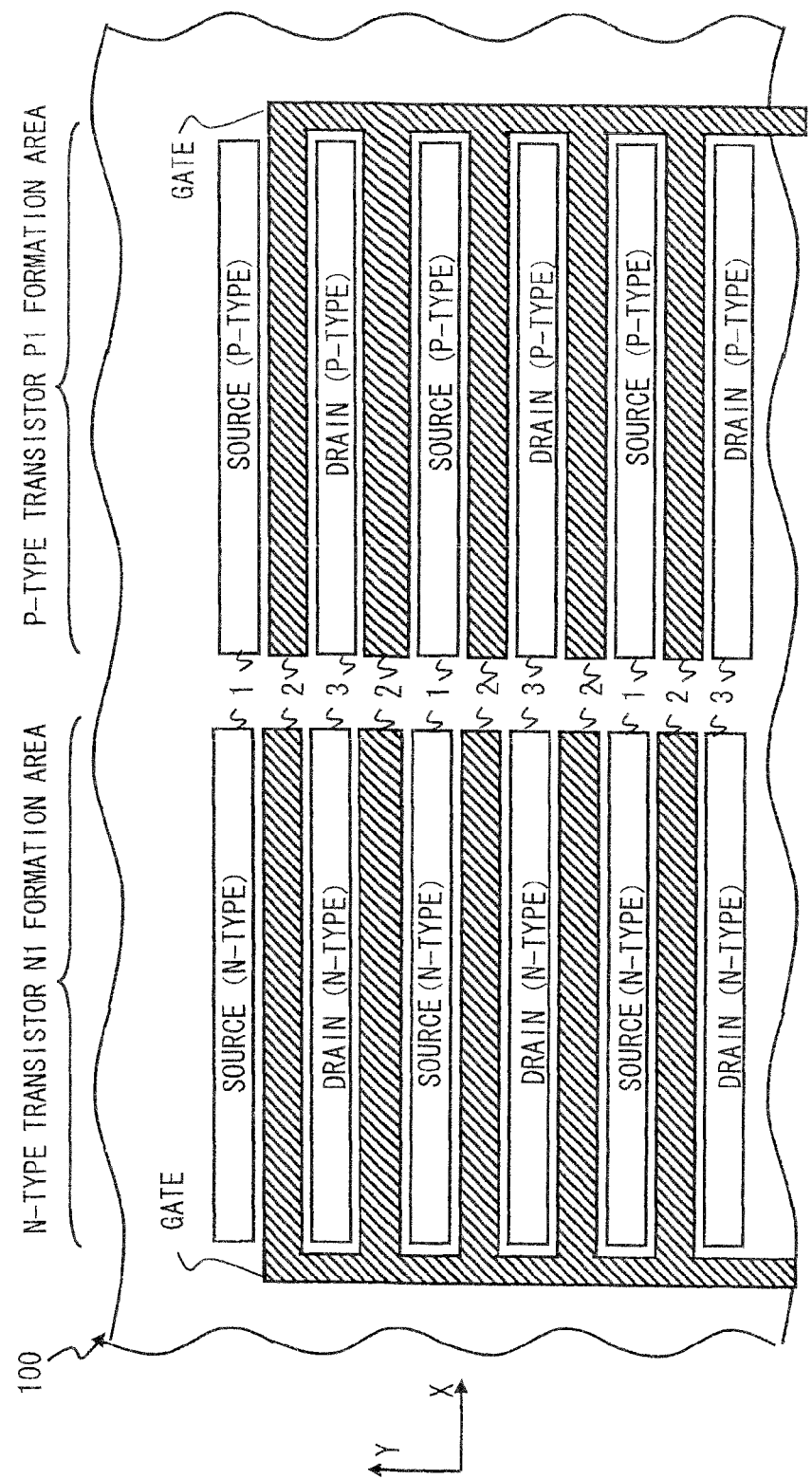
FIG. 13 is a diagram showing the layout of a transistor in the H bridge circuit of the second embodiment.

For configuring such an H bridge circuit, as shown in FIG. 13, a P-type power MOS transistor and an N-type power MOS transistor are disposed side by side. Although FIG. 13 shows only a pair of P-type MOS transistor and N-type MOS transistor, in the H bridge circuit, another pair of transistors are disposed similarly to the pair of FIG. 13. The transistors are each configured as that described by referring to FIGS. 1 to 11, and only vary in conductivity type, i.e., P-type or N type.

Figure 14:
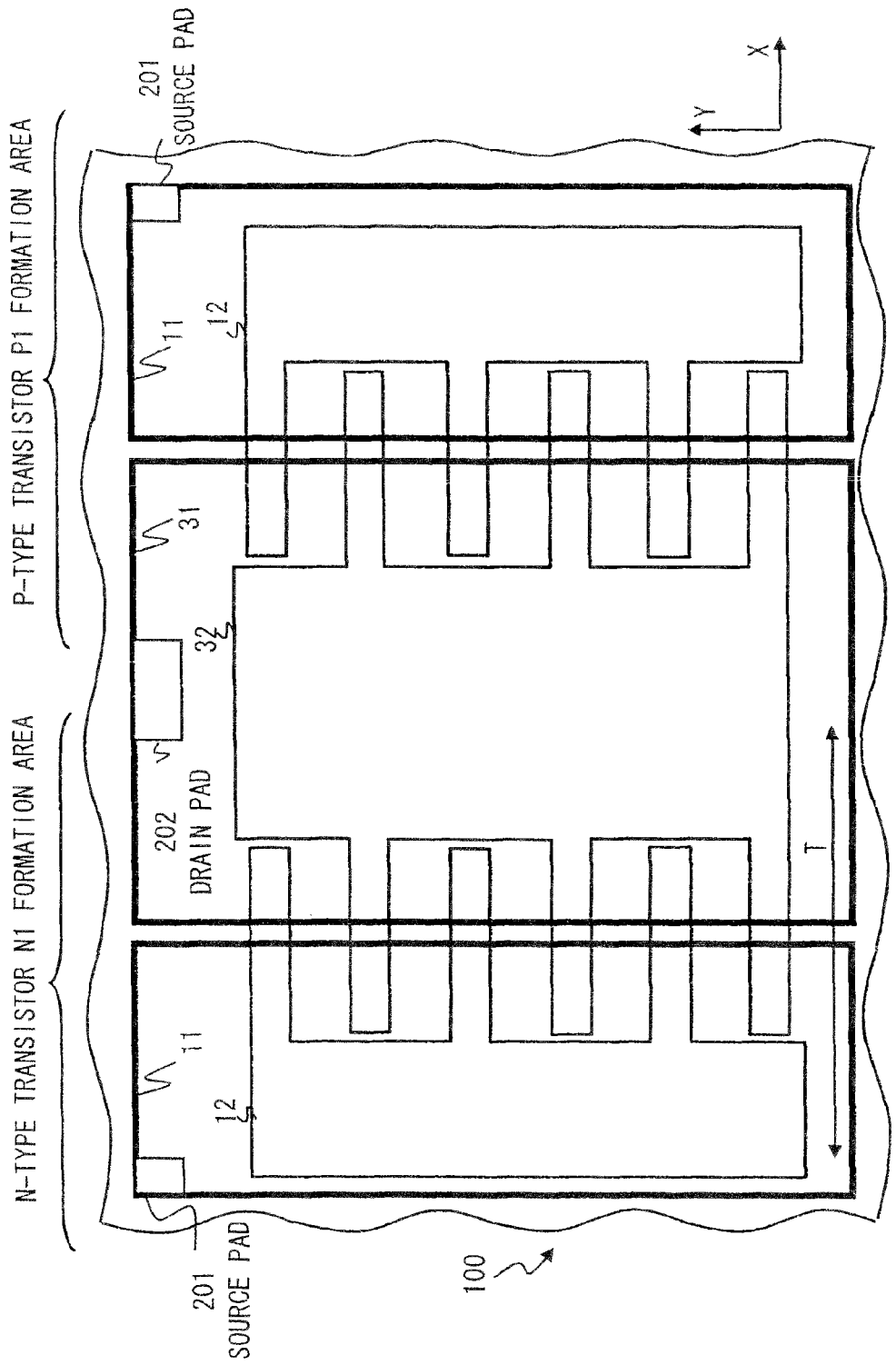
FIG. 14 is a diagram showing the shape of the second and third layers in the H bridge circuit of the second embodiment.
Figure 15:
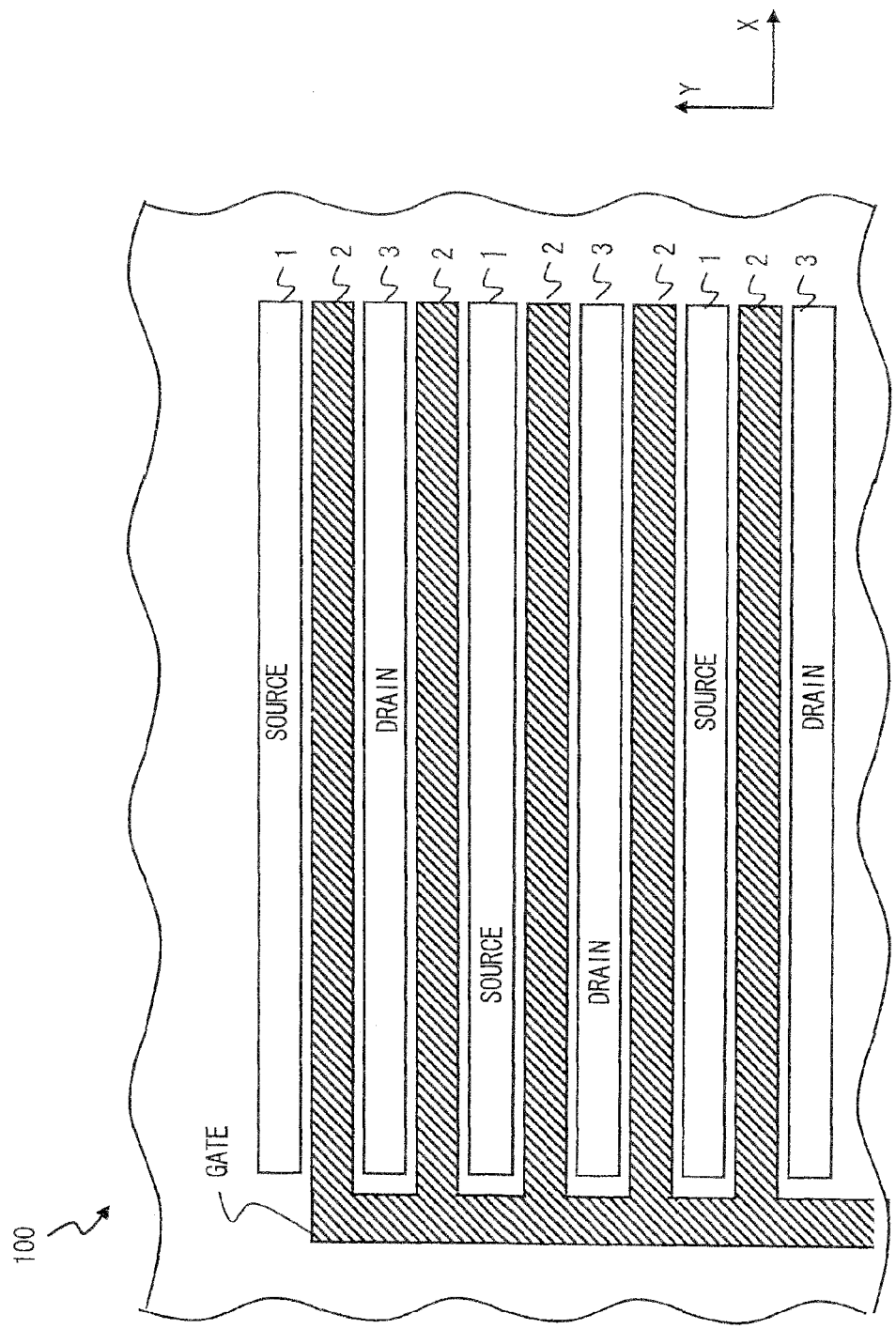
FIG. 15 is a diagram showing the layout of a power transistor.
Figure 16:
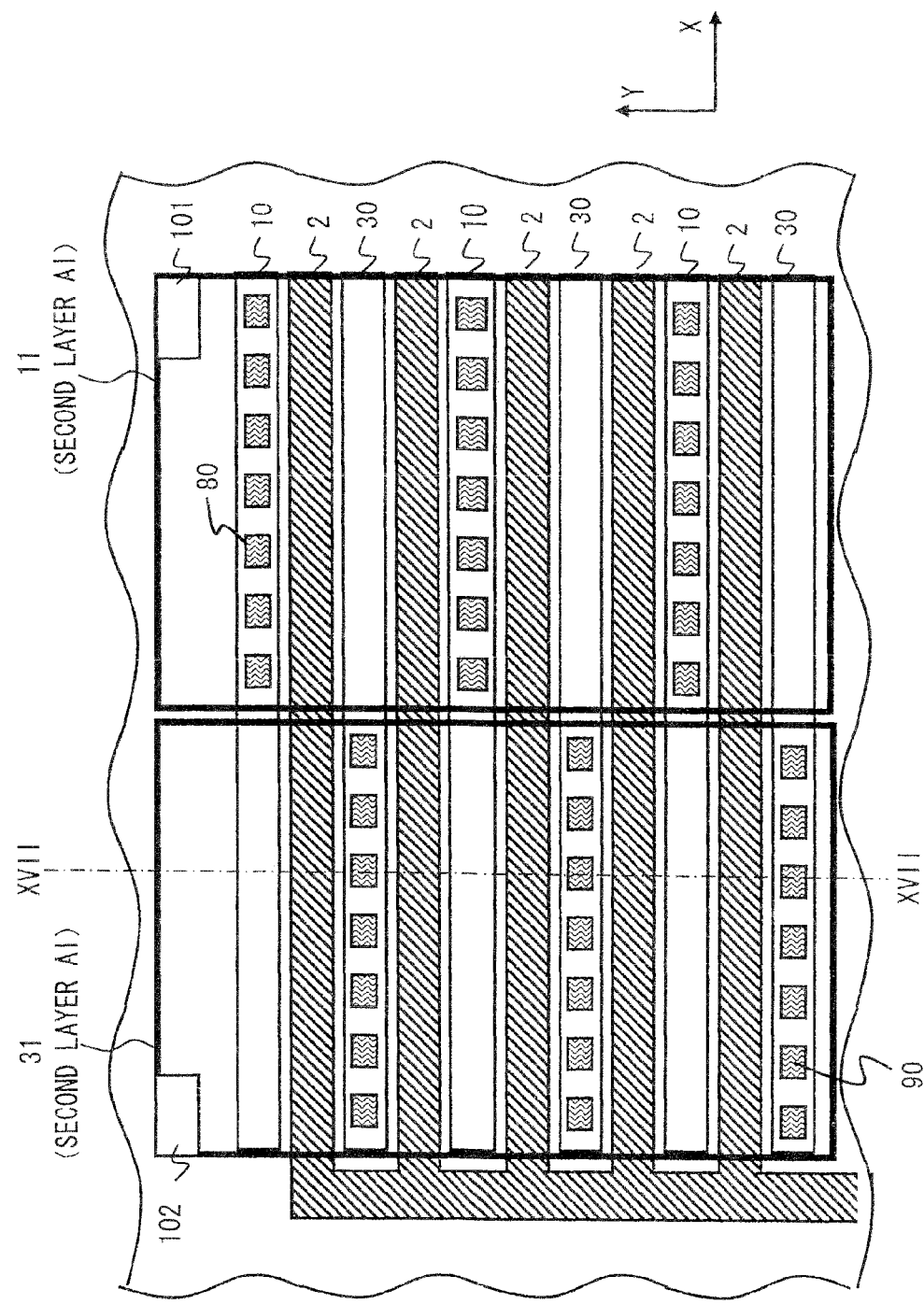
FIG. 16 is a diagram showing the layout of lines and contacts in the power transistor.
Figure 17:
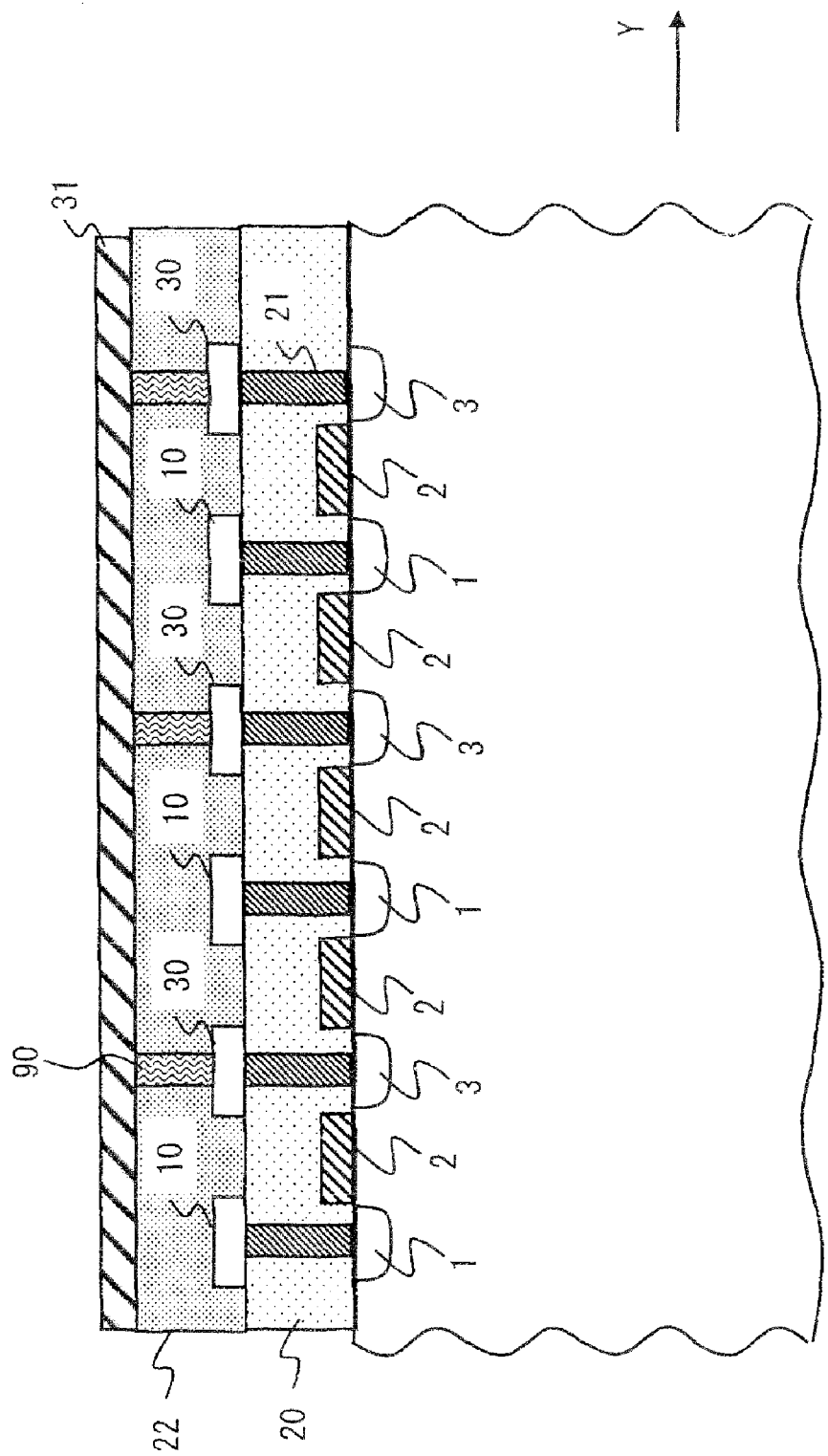
FIG. 17 is a cross-sectional view of FIG. 16 taken along a line XVII-XVII.

Also with the H bridge circuit, the P-type MOS transistor and the N-type MOS transistor are connected by drains, and the drains serve as output terminals. This enables to shape the lines of the second and overlying wiring layers as shown in FIG. 14, and the number of drain pads 202 serving as an output pad can be reduced down to one. Note that also in the lines in the intermediate wiring layer of FIG. 14, in each of the transistors, the relationship in terms of length remains the same among the source regions (or the drain regions) extending in the first direction, the strip-shaped portions, and the solidly-formed portions. That is, assuming that the source regions (or the drain regions) extending in the X direction in the drawing have the length of T, about a half of the length of the lines in the intermediate wiring layer with respect to the extended length, is solidly-formed in the X direction in the drawing, i.e., the coupling section.

As described above in detail, according to the invention, MOS transistor is used as the power transistor, a bipolar transistor or an insulated gate bipolar transistor (IGBT) may also be used. In that case, the first and second semiconductor regions may be emitter and collector regions, respectively. Further, in the bipolar transistor, the gate electrode will be replaced with a base electrode.

As described above in detail, according to the invention, an intermediate line is provided with a coupling section so-called solidly-formed wiring layer (rectangular-shaped line), and first regions shaped similarly to the underlying lines (strip-shaped lines), thereby being able to effectively prevent any possible current concentration in the lines of a power transistor.

The first and second exemplary embodiments can be combined as desirable by one of ordinary skill in the art.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A semiconductor device, comprising:
   a plurality of first underlying lines in an underlying wiring layer electrically connected to and shaped similar to a first semiconductor region;
   a plurality of second underlying lines in the underlying wiring layer electrically connected to and shaped similar to a second semiconductor region;
   a first intermediate line in an intermediate wiring layer electrically connected to the plurality of first underlying lines, the first intermediate line including a plurality of finger regions shaped similarly to the plurality of first underlying lines, and a coupling section to electrically connect the finger regions with each other;
   a second intermediate line in the intermediate wiring layer electrically connected to the plurality of second underlying lines, the second intermediate line including a plurality of finger regions shaped similarly to the plurality of second underlying lines, and a coupling section to electrically connect the finger regions with each other;
   a first overlying line in an overlying wiring layer electrically connected to the first intermediate line; and
   a second overlying line in the overlying wiring layer electrically connected to the second intermediate line.

2. The semiconductor device according to claim 1, further including a power transistor.

3. The semiconductor device according to claim 2, wherein the plurality of first and second underlying lines are strip-shaped.

4. The semiconductor device according to claim 3, wherein the first and second regions are alternately disposed; and the finger region of the first intermediate line and the finger regions of the second intermediate line are staggered with each other.

5. The semiconductor device according to claim 2, wherein the first and second overlying lines are rectangular-shaped and formed over substantially a half of the first and second semiconductor regions respectively.

6. The semiconductor device according to claim 2, wherein the first and second semiconductor regions are source and drain regions, respectively.

7. The semiconductor device according to claim 2, wherein the first and second semiconductor regions are emitter and collector regions, respectively.

8. The semiconductor device according to claim 1, wherein the coupling section of the first intermediate lines has a length equivalent to about a half of a length of the first intermediate lines in a first direction along which the first intermediate lines extends.

9. The semiconductor device according to claim 1, wherein when an given one of the first underlying lines has a length of T in the first direction, and a length of S in a second direction orthogonal to the first direction, the first intermediate line has a portion longer than the length S in the second direction.

10. The semiconductor device according to claim 9, wherein the first intermediate line is shorter than the length T in the first direction.

11. The semiconductor device according to claim 1, wherein when attention is given only to an area immediately above an given one of the first underlying lines, contacts between the first intermediate and first overlying lines are fewer in number than contacts between the first underlying and first intermediate lines.

12. The semiconductor device according to claim 1, wherein the first intermediate line has both a pattern similar to the first underlying lines and a pattern similar to the first overlying line.

* * * * *